May 27, 1969 J. R. CRICCHI ET AL 3,447,046

INTEGRATED COMPLEMENTARY MOS TYPE TRANSISTOR STRUCTURE AND METHOD OF MAKING SAME

Filed May 31, 1967

WITNESSES

Edwin E. Bassler

James F. Young

INVENTORS

James R. Cricchi, Marvin H. White and Raymond M. McLouski

BY

Gordon H. Telfer

ATTORNEY

United States Patent Office 3,447,046
Patented May 27, 1969

3,447,046

INTEGRATED COMPLEMENTARY MOS TYPE TRANSISTOR STRUCTURE AND METHOD OF MAKING SAME

James R. Cricchi, Catonsville, Md., Marvin H. White, Columbus, Ohio, and Raymond M. McLouski, Glen Burnie, Md., assignors to Westinghouse Electric Corporation, Pittsburgh, Pa., a corporation of Pennsylvania Filed May 31, 1967, Ser. No. 642,509
Int. Cl. H01l 11/00, 15/00
U.S. Cl. 317—235 7 Claims

ABSTRACT OF THE DISCLOSURE

Complementary MOS transistors are provided utilizing out-diffusion through an epitaxially grown layer to form a region in which one of the transistor elements is disposed, the epitaxially grown layer being opposite in conductivity type to that of the original substrate with an isolation wall, which may also be out-diffused, extending through the epitaxial layer to the substrate. Preferably the out-diffused regions are formed with a slow diffusing impurity such as arsenic.

BACKGROUND OF THE INVENTION

*Field of the invention*

This application is directed to semiconductor devices, particularly complementary MOS type transistors, and methods of making the same.

An MOS-type transistor generally comprises a first semiconductive region in which source and drain regions of opposite conductivity type are disposed and between which is defined a channel region whose conductivity is variable in accordance with potentials applied to a gate electrode capacitively coupled thereto through an insulating layer disposed on the channel surface. MOS-type transistors are of increasing interest, particularly because of their high input impedance compared with bipolar transistors and also because a large number of such elements may be disposed in a single body of material economically where the intended circuit application requires MOS transistors of only a single polarity.

There are known MOS transistor circuits, particularly for fast switching at low power levels, that require MOS transistors of opposite polarities. Previously such circuits have usually been formed only by using discrete MOS transistors because of difficulty in integrating satisfactory MOS transistors in complementary pairs.

The present invention is related in subject matter to copending application Ser. No. 642,471, filed May 31, 1967 which is directed to the distinct invention of Gallagher and Barditch.

*Description of the prior art*

Because of difficulty in adequately controlling the surface concentration of a directly diffused region and the impracticality of achieving a low enough surface concentration for desirable MOS operation, Gallagher and Barditch in the above-referred to copending application disclose the formation of the region in which the complementary transistor is provided by out-diffusion through an epitaxial layer to achieve a positive impurity concentration gradient from the surface, which concentration is sufficiently low at the surface and controllable to provide improved MOS characteristics.

SUMMARY OF THE INVENTION

It has been found that the manner in which the process generally disclosed by Gallagher et al. is carried out is of considerable importance in determining the characteristics and usefulness of the structure.

In accordance with this invention the out-diffusion is preferably performed using a relatively slow diffusing impurity, such as arsenic. This is to avoid excessive out-diffusion or out-vaporization during the epitaxial deposition that would tend to convert the entire epitaxial layer if a relatively fast impurity, such as boron, were used.

Another important feature is the provision of a substrate of one conductivity type on which is selectively deposited a quantity of doping impurity of the same type as that predominating in the substrate and over which is grown an epitaxial layer of opposite type so that the deposited impurities, by out-diffusion, form a region having a positive impurity concentration gradient from the surface over its total area. The value of the difference in conductivity type between the substrate and the epitaxial layer in providing the complementary MOS transistors is at least threefold. One advantage is to provide a means of measurement and control of the epitaxial layer since the layer thickness should be known to provide information for controlling the out-diffusion process. Also, if the epitaxial layer and the substrate are of the same conductivity type and opposite to that of the out-diffused region, there is some danger of smearing of impurities during out-diffusion with a resultant loss of isolation between different portions of the structure with no corresponding advantage. By using a substrate of the same conductivity type as the out-diffused region good contact can be made via the bottom of the structure to the out-diffused regions.

The term MOS is an acronym for metal-oxide-semiconductor. Throughout this application, however, it is to be understood that a reference to "MOS transistors," or the like, is intended to encompass the described type of device whether the insulating material is in fact an oxide layer or some other insulating material such as a nitride, a mixture or a nonhomogeneous layer. An alternative expression that may be employed to cover the class of devices with which the present invention is concerned is IGFET which is an acronym for insulated-gate-field-effect-transistor.

DESCRIPTION OF THE PREFERRED EMBODIMENTS

An understanding of the present invention and its various embodiments will be facilitated by reference to the above-referred to copending application by Gallagher and Barditch.

Figure 1:
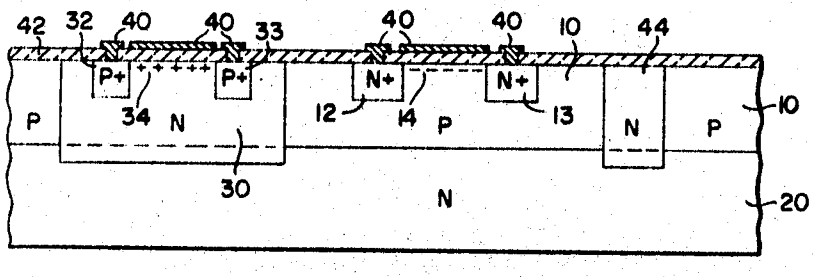
FIGURE 1 of the drawing is a partial sectional view of a semiconductor structure in accordance with the present invention.

FIGURE 1 of the drawing illustrates a complementary MOS type transistor structure wherein a first MOS type transistor of a first polarity is provided within a layer 10 of p type conductivity epitaxially grown material with n type source and drain regions 12 and 13 disposed therein defining a first channel region 14. The epitaxial layer 10 extends throughout the structure but has been modified in conductivity type in some portions. The epitaxially grown layer 10 is disposed on a substrate 20 of n type conductivity type. Although the semiconductivity type of the various regions may be reversed from that shown it is important that the substrate 20 and epitaxially grown layer 10 be of opposite conductivity type.

A second MOS type transistor of a second polarity is provided by a principal region 30 of n type conductivity material that extends from a portion of the substrate 30 through the epitaxially grown layer 10 and has a positive impurity concentration gradient (i.e., the impurity concentration increases) from the exposed surface of the epitaxially grown layer. Source and drain regions 32 and 33 of p type conductivity are disposed within the region 30 having a positive impurity concentration gradient to define a second channel region 34.

Contacts 40 are applied to the respective source and drain regions and over an insulating layer 42 that covers each of the channel regions for gate electrodes.

If desired the region 30 of positive impurity concentration gradient may be utilized as one of the source and drain regions of the transistor of first polarity. Additionally the source and drain regions of the first transistor may be also formed by out diffusion during the same sequence of operations as that for the principal region of the second polarity transistor.

In fabrication, a substrate 20 of n type monocrystalline, commercial device quality, silicon may be employed having a resistivity of about 5 to 10 ohm centimeters. Into a surface by selective diffusion techniques through an insulating layer mask an impurity deposition is formed in a portion of the substrate surface for the out-diffused region. For this purpose a relatively slow diffusing impurity, for example arsenic, may be deposited in a thin layer to a surface concentration of about $10^{20}$ or $10^{21}$ atoms per cubic centimeter and a thickness of about 2 microns or less.

The epitaxial layer 10 of opposite conductivity type and approximately 12 microns thickness is then grown over the entire substrate employing conventional epitaxial growth reactions such as the thermal decomposition of silicon tetrachloride with hydrogen in the presence of an appropriate dopant such as diborane for producing p type material. This deposition process is then followed by a separate out-diffusion process which may be performed at about 1200° C. for about 60 hours during which the impurities of the deposited region out-diffuse to the surface of the epitaxial layer. The out-diffused region may then have a surface concentration as low as $10^{14}$ to $5\times10^{15}$ atoms per cc. The p type epitaxial layer 10 may suitably have a resistivity of about 0.5 to 2.0 ohm centimeters. Diffusion of the source and drain regions in each of the different transistor elements may be performed conventionally by selective diffusion techniques to a surface concentration of about $10^{19}$ to $10^{20}$ atoms per cubic centimeter for the p+ source and drain regions and surface concentration of about $10^{20}$ to$10^{21}$ atoms per cubic centimeter for the n+ source and drain regions in regions having a thickness of about 2 to 3 microns. Application of an insulating layer over the channel regions and the application of contacts to the various regions may be conventionally performed.

The fabrication process may be modified by employing other semiconductor materials, dopants, reverse conductivity type and other features as is known in the art.

In addition the structure of FIGURE 1 illustrates a diffused isolation wall 44 extending through the epitaxial layer 10 to the substrate 20. Such a wall may be located as desired in an integrated circuit structure to isolate the MOS transistor elements from other portions of the epitaxial layer which may be used for formation of other electronic elements therein.

In instances in which the integrated circuit includes only MOS elements, isolation walls through the epitaxial layer are unnecessary. In most complementary MOS transistor circuits, the main regions (e.g. out-diffused region 30) of one polarity transistors are connected together (as they are here by the substrate 20). The main regions of the other polarity transistors are also connected together (as layer 10 does) but must be isolated from the other polarity regions (as by the junction between layer 10 and the substrate 20).

The normally occurring bias voltages maintain the substrate junction in reverse bias. That junction does not contribute to parasitic capacitance since each adjacent region is connected to a power supply.

Another advantage of the invention is that the required low surface concentration in the out-diffused region 30 can be obtained while also obtaining a very low sheet resistance (e.g. 30 ohms per square). Thus this layer (substrate 20) can be used as the positive voltage power supply bus which eases the problem of making interconnections and makes it possible for the integrated circuit to be smaller.

Figure 2:
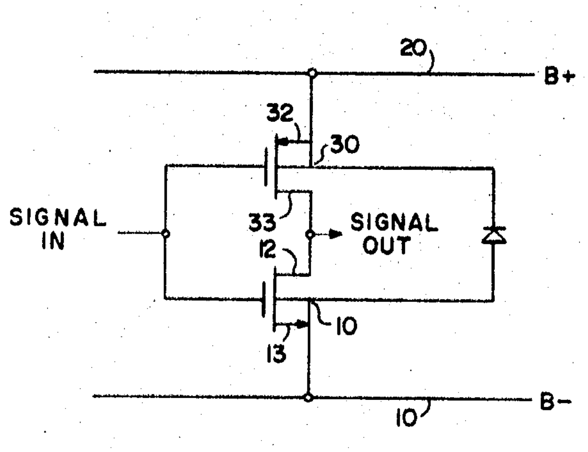
FIG. 2 is a circuit schematic showing a typical application of the structure of FIG. 1.

FIG. 2 illustrates a typical circuit application of structures in accordance with this invention. The same reference numerals are used to designate elements as for the corresponding elements of FIG. 1.

While the present invention has been shown and described in a few forms only, it will be apparent that various other indications may be made without departing from its spirit and scope.

We claim as our invention:

1. A complementary MOS-type transistor structure comprising: a first MOS-type transistor of a first polarity including a layer of a first conductivity type with first and second regions of a second conductivity type in a surface of said layer and each forming a PN junction therewith to provide first source and drain regions spaced a first distance to define a first channel region at the surface of said layer; said layer being disposed on a substrate of said second conductivity type and forming a PN junction therewith; a second MOS-type transistor of a second polarity including a principal region of said second conductivity type disposed in a portion of said substrate and extending through said layer and having a positive impurity concentration gradient from the exposed surface of said layer over the entire area of said principal region; third and fourth regions of said first conductivity type in said principal region and each forming a PN junction therewith to provide second source and drain regions spaced a second distance to define a second channel region at the surface of said principal region; isolation means extending through said epitaxial layer to said substrate separating portions of said first conductivity type material of said layer.

2. The subject matter of claim 1 further comprising: a layer of insulating material covering at least said channel regions, and contacts on each of said source and drain regions and on said layer of insulating material over each of said channel regions.

3. The subject matter of claim 1 wherein said isolation means is a wall of material of the same conductivity type and impurity concentration gradient as said principal region of said second transistor, said wall forming a PN junction with said epitaxial layer.

4. The subject matter of claim 1 wherein: said first conductivity type is p type, said second conductivity type is n type and the predominant dopant in said principal region of said second conductivity type is arsenic.

5. In a method of forming a complementary MOS-type transistor structure, the steps including: forming a layer of insulating material on a major surface of a body of semiconductive material of N type conductivity; selectively removing a limited portion of said insulating layer; depositing a quantity of dopant material containing arsenic as the predominant dopant within the exposed portion of said major surface; depositing epitaxially a layer of semiconductive material of P type conductivity over said major surface; redistributing said quantity of dopant material to form a region of N type conductivity extending through said epitaxially deposited layer and having a positive impurity concentration gradient from said surface; selectively diffusing source and drain regions of P type conductivity in said N type region having a positive impurity concentration gradient.

6. The subject matter of claim 5 wherein: source and drain regions of N type conductivity are selectively diffused in the surface of said epitaxially deposited layer, the selective diffusions of said P and N type source and drain regions being performed subsequent to said redistributing to form said N type region having a positive impurity concentration gradient.

7. The subject matter of claim 5 wherein: steps of selectively removing an additional limited portion of said insulating layer, depositing a quantity of dopant material containing arsenic as the predominant dopant therein and redistributing said quantity of dopant material to form an isolation wall of N type conductivity extending through said epitaxial layer are performed simultaneously with said steps corresponding thereto for said region having a positive impurity concentration gradient.

References Cited

UNITED STATES PATENTS

| | | | |
|---|---|---|---|
| 3,340,598 | 9/1967 | Hatcher | 29—571 |
| 3,341,755 | 9/1967 | Husher et al. | 317—235 |
| 3,356,858 | 12/1967 | Wanlass | 307—88.5 |

JOHN W. HUCKERT, *Primary Examiner.*

R. SANDLER, *Assistant Examiner.*

U.S. Cl. X.R.

148—175